United States Patent
Tamura et al.

(10) Patent No.: US 11,935,729 B2
(45) Date of Patent: Mar. 19, 2024

(54) SUBSTRATE SUPPORT AND PLASMA PROCESSING APPARATUS

(71) Applicant: Tokyo Electron Limited, Tokyo (JP)

(72) Inventors: Hajime Tamura, Miyagi (JP); Yasuharu Sasaki, Miyagi (JP); Shin Yamaguchi, Miyagi (JP); Tsuguto Sugawara, Miyagi (JP); Katsuyuki Koizumi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 83 days.

(21) Appl. No.: 17/190,178

(22) Filed: Mar. 2, 2021

(65) Prior Publication Data
US 2021/0305025 A1    Sep. 30, 2021

(30) Foreign Application Priority Data
Mar. 25, 2020  (JP) .................................. 2020-054019

(51) Int. Cl.
*H01J 37/32* (2006.01)
*H02N 13/00* (2006.01)

(52) U.S. Cl.
CPC .. *H01J 37/32715* (2013.01); *H01J 37/32082* (2013.01); *H01J 37/32642* (2013.01); *H02N 13/00* (2013.01); *H01J 2237/2007* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 11,532,456 B2 | 12/2022 | Koshimizu | |
| 2004/0261946 A1* | 12/2004 | Endoh | H01L 21/6831 |
| | | | 156/345.1 |
| 2006/0196605 A1 | 9/2006 | Ikegami et al. | |
| 2008/0236492 A1 | 10/2008 | Yamazawa | |
| 2009/0026170 A1 | 1/2009 | Tanaka et al. | |
| 2011/0031217 A1* | 2/2011 | Himori | H01J 37/32165 |
| | | | 156/345.48 |
| 2011/0253672 A1 | 10/2011 | Kamibayashi et al. | |
| 2018/0082824 A1 | 3/2018 | Likhanskii et al. | |

(Continued)

FOREIGN PATENT DOCUMENTS

| JP | 2005-064460 A | 3/2005 |
|---|---|---|
| JP | 2019-036658 A | 3/2019 |
| JP | 2019-192876 A | 10/2019 |

OTHER PUBLICATIONS

Chishio Koshimizu, U.S. Appl. No. 17/190,552, filed Mar. 3, 2021, which corresponds to U.S. Appl. No. 17/190,178.

*Primary Examiner* — Jeffrie R Lund
*Assistant Examiner* — Tiffany Z Nuckols
(74) *Attorney, Agent, or Firm* — Studebaker & Brackett PC (57) ABSTRACT

The disclosed substrate support includes a first region, a second region, a first electrode, and a second electrode. The first region is configured to hold a substrate placed thereon. The second region is provided to surround the first region and configured to hold an edge ring placed thereon. The first electrode is provided in the first region to receive a first electrical bias. The second electrode is provided in at least the second region to receive a second electrical bias. The second electrode extends below the first electrode to face the first electrode within the first region.

7 Claims, 9 Drawing Sheets

(56) References Cited

U.S. PATENT DOCUMENTS

| | | |
|---|---|---|
| 2018/0204757 A1 | 7/2018 | Fushimi |
| 2019/0043697 A1* | 2/2019 | Joubert ............. H01J 37/32642 |
| 2019/0088520 A1 | 3/2019 | Kraus et al. |
| 2019/0267218 A1* | 8/2019 | Wang ................ H01L 21/67109 |
| 2020/0135527 A1 | 4/2020 | Sung et al. |
| 2020/0185193 A1 | 6/2020 | Koshimizu |
| 2020/0219701 A1 | 7/2020 | Koshimizu |
| 2021/0074524 A1 | 3/2021 | Koshimizu |
| 2021/0296098 A1* | 9/2021 | Cho .................... H01L 21/6831 |
| 2021/0305025 A1 | 9/2021 | Tamura et al. |
| 2022/0108878 A1 | 4/2022 | Koshimizu |
| 2022/0384150 A1 | 12/2022 | Koshimizu |
| 2023/0050506 A1 | 2/2023 | Koshimizu |

* cited by examiner

SUBSTRATE SUPPORT AND PLASMA PROCESSING APPARATUS

CROSS-REFERENCE TO RELATED APPLICATIONS

This application is based on and claims the benefit of priority from Japanese Patent Application No. 2020-054019 filed on Mar. 25, 2020, the entire contents of which are incorporated herein by reference.

FIELD

Exemplary embodiments of the present disclosure relate to a substrate support and a plasma processing apparatus.

BACKGROUND

A plasma processing apparatus is used in plasma processing on a substrate, The substrate is disposed on a bias electrode and in a region surrounded by an edge ring in a chamber of the plasma processing apparatus. The edge ring is disposed on a ring electrode. US Patent Application Publication No. 2018/0082824 discloses such a plasma processing apparatus. The plasma processing apparatus disclosed in US Patent Application Publication No. 2018/0082824 is provided with two bias power sources. The two bias power sources are connected to the bias electrode and the ring electrode, respectively, in order to form a flat plasma sheath on the substrate.

SUMMARY

In an exemplary embodiment, a substrate support is provided. The substrate support includes a first region, a second region, a first electrode, and a second electrode. The first region is configured to hold a substrate placed thereon. The second region is provided to surround the first region and configured to hold an edge ring placed thereon. The first electrode is provided in the first region to receive a first electrical bias. The second electrode is provided in at least the second region to receive a second electrical bias. The second electrode extends below the first electrode to face the first electrode within the first region.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Hereinafter, various exemplary embodiments will be described.

In an exemplary embodiment, a substrate support is provided. The substrate support includes a first region, a second region, a first electrode, and a second electrode. The first region is configured to hold a substrate placed thereon. The second region is provided to surround the first region and configured to hold an edge ring placed thereon. The first electrode is provided in the first region to receive a first electrical bias. The second electrode is provided in at least the second region to receive a second electrical bias. The second electrode extends below the first electrode to thee the first electrode within the first region.

In the substrate support of the above embodiment, since the first electrode and the second electrode face each other in the first region, the first electrode and the second electrode are capacitively coupled to each other in the first region. Therefore, a part of the second electrical bias is applied to the first electrode, and a part of the first electrical bias is applied to the second electrode. Therefore, the potential difference between the first electrode and the second electrode due to the phase difference between the first electrical bias and the second electrical bias is reduced, and the potential difference between the substrate and the edge ring due to the phase difference is reduced. As a result, the influence of the phase difference between the first electrical bias and the second electrical bias on the plasma processing is reduced.

In an exemplary embodiment, the first region may configure a first electrostatic chuck configured to hold the substrate placed thereon. The second region may configure a second electrostatic chuck configured to hold the edge ring placed thereon.

In an exemplary embodiment, the first region may include a first dielectric portion and a second dielectric portion. The first dielectric portion extends around the first electrode. The second dielectric portion is formed of a dielectric different from a dielectric forming the first dielectric portion. The second dielectric portion is provided between the first electrode and the second electrode.

In an exemplary embodiment, at least a part of the second electrode may protrude from the second region into the first region.

In another exemplary embodiment, a plasma processing apparatus or an apparatus for plasma processing is provided. The plasma processing apparatus includes a chamber and a substrate support. The substrate support is a substrate support of any one of the aforementioned exemplary embodiments. The substrate support is configured to support a substrate and an edge ring in the chamber.

In an exemplary embodiment, the plasma processing apparatus may further include a first bias power source and a second bias power source. The first bias power source is configured to generate the first electrical bias and electrically connected to the first electrode. The second bias power source is configured to generate the second electrical bias and electrically connected to the second electrode.

In an exemplary embodiment, each of the first electrical bias and the second electrical bias may be a radio frequency power. In an exemplary embodiment, each of the first electrical bias and the second electrical bias may be a pulse wave that includes a pulse of a negative direct-current voltage and is periodically generated.

In still exemplary embodiment, a plasma processing apparatus is provided. The plasma processing apparatus includes a chamber, a first bias power source, a second bias power source, a substrate support, a first electrical path, a second electrical path, and a capacitor. The first bias power source is configured to generate a first electrical bias. The second bias power source is configured to generate a second electrical bias. The substrate support is configured to support a substrate and an edge ring in the chamber. The substrate support has a first region, a second region, a first electrode, and a second electrode. The first region is configured to hold the substrate placed thereon. The second region is provided to surround the first region and configured to hold the edge ring placed thereon. The first electrode is provided in the first region to receive the first electrical bias. The second electrode is provided in the second region to receive the second electrical bias. The first electrical path is connected between the first bias power source and the first electrode. The second electrical path is connected between the second bias power source and the second electrode. The capacitor is connected between the first electrical path and the second electrical path.

In the plasma processing apparatus of the above embodiment, the first electrode and the second electrode are capacitively coupled to each other by a capacitor. Therefore, a part of the second electrical bias is applied to the first electrode, and a part of the first electrical bias is applied to the second electrode. Therefore, the potential difference between the first electrode and the second electrode due to the phase difference between the first electrical bias and the second electrical bias is reduced, and the potential difference between the substrate and the edge ring due to the phase difference is reduced. As a result, the influence of the phase difference between the first electrical bias and the second electrical bias on the plasma processing is reduced.

In an exemplary embodiment, each of the first electrical bias and the second electrical bias may be a radio frequency power. In an exemplary embodiment, each of the first electrical bias and the second electrical bias may be a pulse wave that includes a pulse of a negative direct-current voltage and is periodically generated.

In an exemplary embodiment, the capacitor may be a variable capacitor

Hereinafter, various exemplary embodiments will be described in detail with reference to the drawings. In the drawings, the same or equivalent portions are denoted by the same reference symbols.

Figure 1:
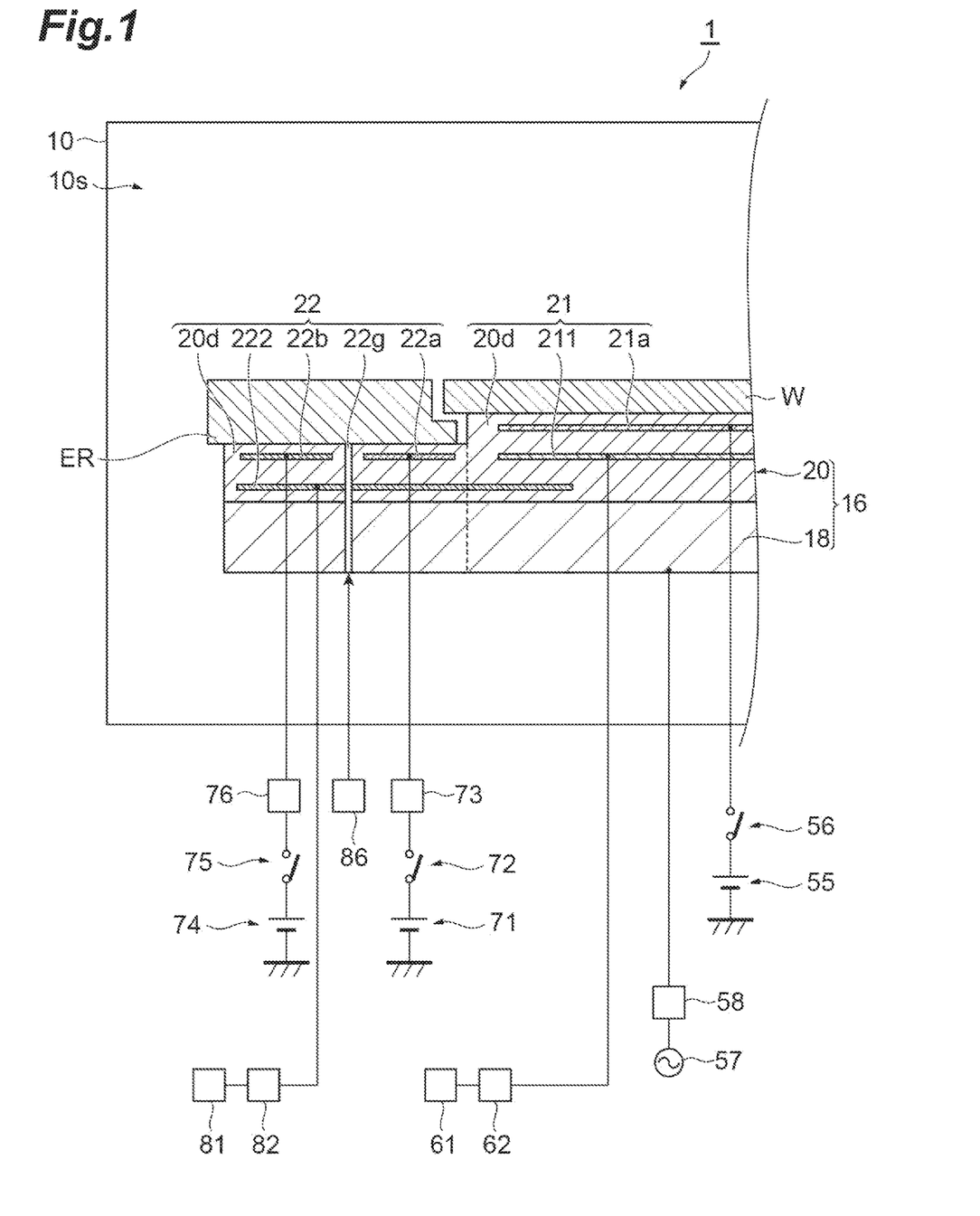
FIG. 1 schematically illustrates a plasma processing apparatus according to an exemplary embodiment.
Figure 2:
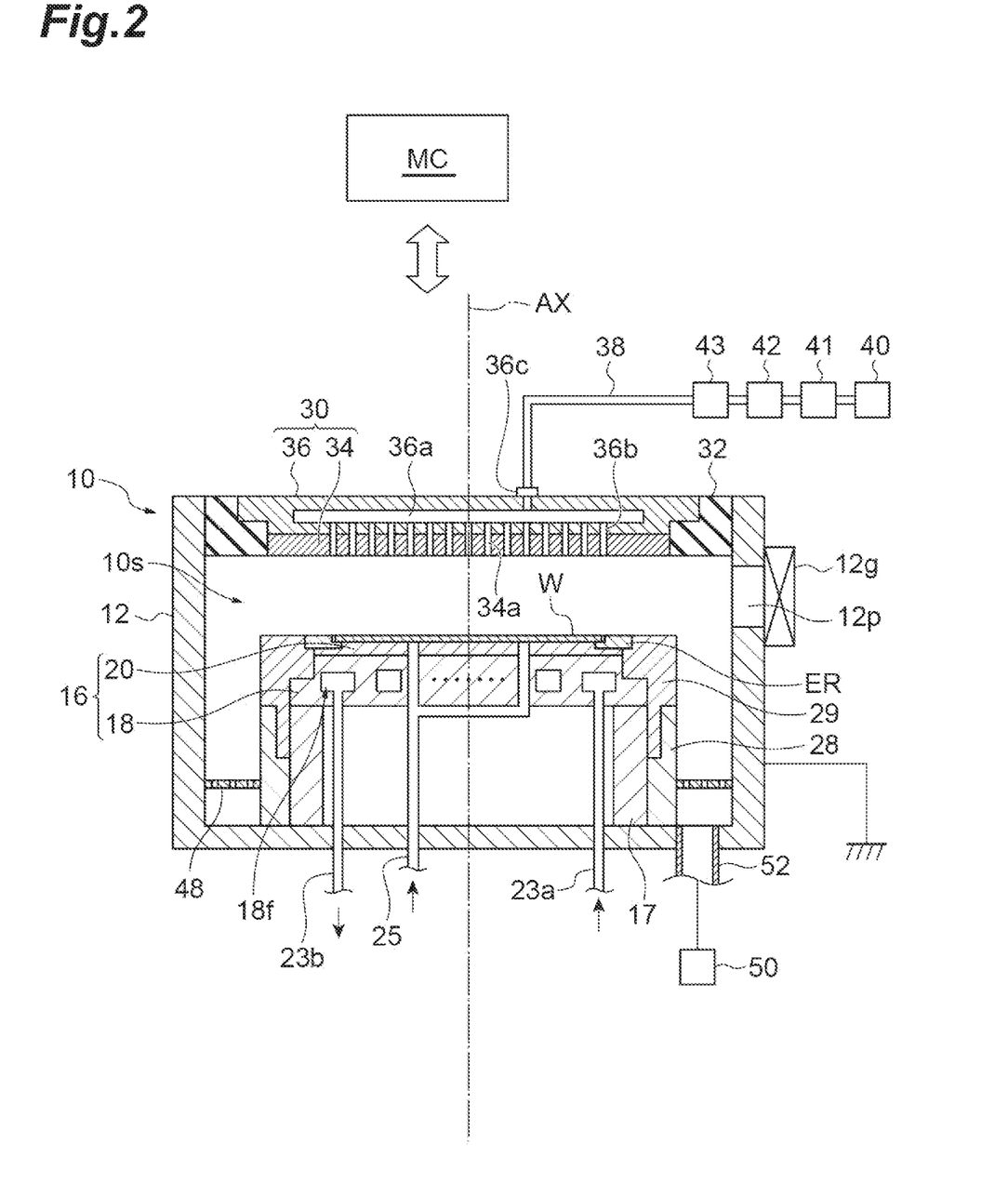
FIG. 2 illustrates a configuration in a chamber of the plasma processing apparatus according to an exemplary embodiment.

FIG. 1 schematically illustrates a plasma processing apparatus according to an exemplary embodiment. The plasma processing apparatus 1 shown in FIG. 1 is provided with a chamber 10. FIG. 2 illustrates a configuration in the chamber of the plasma processing apparatus according to an exemplary embodiment. As shown in FIG. 2, the plasma processing apparatus 1 may be a capacitively coupled plasma processing apparatus.

The chamber 10 provides an internal space 10s therein. The central axis of the internal space 10s is an axis AX which extends in the vertical direction. In an embodiment, the chamber 10 includes a chamber body 12. The chamber body 12 has a substantially cylindrical shape. The internal space 10s is provided in the chamber body 12. The chamber body 12 is formed of, for example, aluminum. The chamber body 12 is electrically grounded. A film having plasma resistance is formed on the inner wall surface of the chamber body 12, that is, the wall surface defining the internal space 10s. This film may be a film formed by anodization or a ceramic film such as a film formed of yttrium oxide.

A passage 12p is limited in a side wall of the chamber body 12. A substrate W passes through the passage 12p when it is transferred between the internal space 10s and the outside of the chamber 10. A gate valve 12g is provided along the side wall of the chamber body 12 for opening and closing of the passage 12p.

The plasma processing apparatus 1 is further provided with a substrate support 16. The substrate support 16 is configured to support the substrate W placed thereon in the chamber 10. The substrate W has a substantially disk shape. The substrate support 16 is supported by the support 17. The support 17 extends upward from a bottom portion of the chamber body 12. The support 17 has a substantially cylindrical shape. The support 17 is formed of an insulating material such as quartz.

The substrate support 16 has a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is formed in the lower electrode 18. The flow path 18f is a flow path for a heat exchange medium. As the heat exchange medium, for example, a liquid refrigerant is used. A supply device for the heat exchange medium (for example, a chiller unit) is connected to the flow path 18f. The supply device is provided outside the chamber 10. The heat exchange medium is supplied from the supply device to the flow path 18f through a pipe 23a. The heat exchange medium supplied to the flow path 18f is returned to the supply device through a pipe 23b.

The electrostatic chuck 20 is provided on the lower electrode 18, As shown in FIG. 1, the electrostatic chuck 20 has a dielectric portion 20d and an electrode 21a, The dielectric portion 20d is formed of a dielectric. The dielectric portion 20d is formed of, for example, aluminum nitride or aluminum oxide. The electrostatic chuck 20 further has an electrode 22a and an electrode 22b. When the substrate W is processed in the internal space 10s, the substrate W is placed on the electrostatic chuck 20 and held by the electrostatic chuck 20. Further, an edge ring ER is mounted on the substrate support 16. The edge ring ER is a plate having a substantially ring shape. The edge ring ER is formed of, for example, silicon, silicon carbide, or quartz. As shown in FIG. 2, the edge ring ER is mounted on the substrate support 16 such that the central axis coincides with the axis AX. The substrate W accommodated in the chamber 10 is disposed on the electrostatic chuck 20 and in a region surrounded by the edge ring ER.

The plasma processing apparatus 1 may be further provided with a gas line 25. The gas line 25 supplies a heat transfer gas, for example, a He gas, from a gas supply mechanism to a gap between the upper surface of the electrostatic chuck 20 (a first region to be described later) and the rear surface (lower surface) of the substrate W.

The plasma processing apparatus 1 may be further provided with an outer peripheral portion 28 and an outer peripheral portion 29. The outer peripheral portion 28 extends upward from the bottom portion of the chamber body 12. The outer peripheral portion 28 has a substantially cylindrical shape and extends along the outer periphery of the support 17. The outer peripheral portion 28 is formed of a conductive material. The outer peripheral portion 28 is electrically grounded. A film having plasma resistance is formed on the surface of the outer peripheral portion 28. This film may be a film formed by anodization or a ceramic film such as a film formed of yttrium oxide.

The outer peripheral portion 29 is provided on the outer peripheral portion 28. The outer peripheral portion 29 is formed of a material having insulation properties. The outer peripheral portion 29 is formed of ceramic such as quartz. The outer peripheral portion 29 has a substantially cylindrical shape. The outer peripheral portion 29 extends along the outer peripheries of the lower electrode 18 and the electrostatic chuck 20.

The plasma processing apparatus 1 is further provided with an upper electrode 30. The upper electrode 30 is provided above the substrate support 16. The upper electrode 30 closes an upper opening of the chamber body 12 together with a member 32. The member 32 has insulation properties. The upper electrode 30 is supported on an upper portion of the chamber body 12 through the member 32.

The upper electrode 30 includes a ceiling plate 34 and a support 36. The lower surface of the ceiling plate 34 defines the internal space 10s. A plurality of gas discharge holes 34a are formed in the ceiling plate 34. Each of the plurality of gas discharge holes 34a penetrates the ceiling plate 34 in a plate thickness direction (the vertical direction). The ceiling plate 34 is formed of, for example, silicon. Alternatively, the ceiling plate 34 may have a structure in which a plasma-resistant film is provided on the surface of a member made of aluminum. This film may be a film formed by anodization or a ceramic film such as a film formed of yttrium oxide.

The support 36 detachably supports the ceiling plate 34. The support 36 is formed of a conductive material such as aluminum, for example. A gas diffusion chamber 36a is provided in the interior of the support 36. A plurality of gas holes 36b extend downward from the gas diffusion chamber 36a. The plurality of gas holes 36b communicate with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply gases from one or more gas sources selected from the plurality of gas sources of the gas source group 40 to the internal space 10s at individually adjusted flow rates.

A baffle plate 48 is provided between the outer peripheral portion 28 and the side wall of the chamber body 12. The baffle plate 48 may be configured, for example, by coating a member made of aluminum with ceramic such as yttrium oxide. A number of through-holes are formed in the baffle plate 48. An exhaust pipe 52 is connected to the bottom portion of the chamber body 12 below the baffle plate 48. An exhaust device 50 is connected to the exhaust pipe 52. The exhaust device 50 has a pressure controller such as an automatic pressure control valve, and a vacuum pump such as a turbo molecular pump, and can reduce the pressure in the internal space 10s.

Hereinafter, the substrate support 16 will be described in detail. As described above, the substrate support 16 has the lower electrode 18 and the electrostatic chuck 20. As shown in FIG. 1, the plasma processing apparatus 1 has a radio frequency power source 57. The radio frequency power source 57 is connected to the lower electrode 18 through a matcher 58. The radio frequency power source 57 is a power source that generates a radio frequency power for plasma generation. The radio frequency power generated by the radio frequency power source 57 has a first frequency. The first frequency may be a frequency within the range of 27 to 100 MHz. The first frequency is, for example, a frequency of 40 MHz or 60 MHz. The matcher 58 has a matching circuit for matching the impedance on the load side (the lower electrode 18 side) of the radio frequency power source 57 with the output impedance of the radio frequency power source 57. The radio frequency power source 57 may not be electrically connected to the lower electrode 18, and may be connected to the upper electrode 30 through the matcher 58.

In the plasma processing apparatus 1, a radio frequency electric field is generated in the chamber 10 by the radio frequency power from the radio frequency power source 57. The gas in the chamber 10 is excited by the generated radio frequency electric field. As a result, a plasma is generated in the chamber 10. The substrate W is processed with chemical species such as ions and/or radicals from the generated plasma. The processing of the substrate W with the chemical species from the plasma is, for example, etching.

Figure 3:
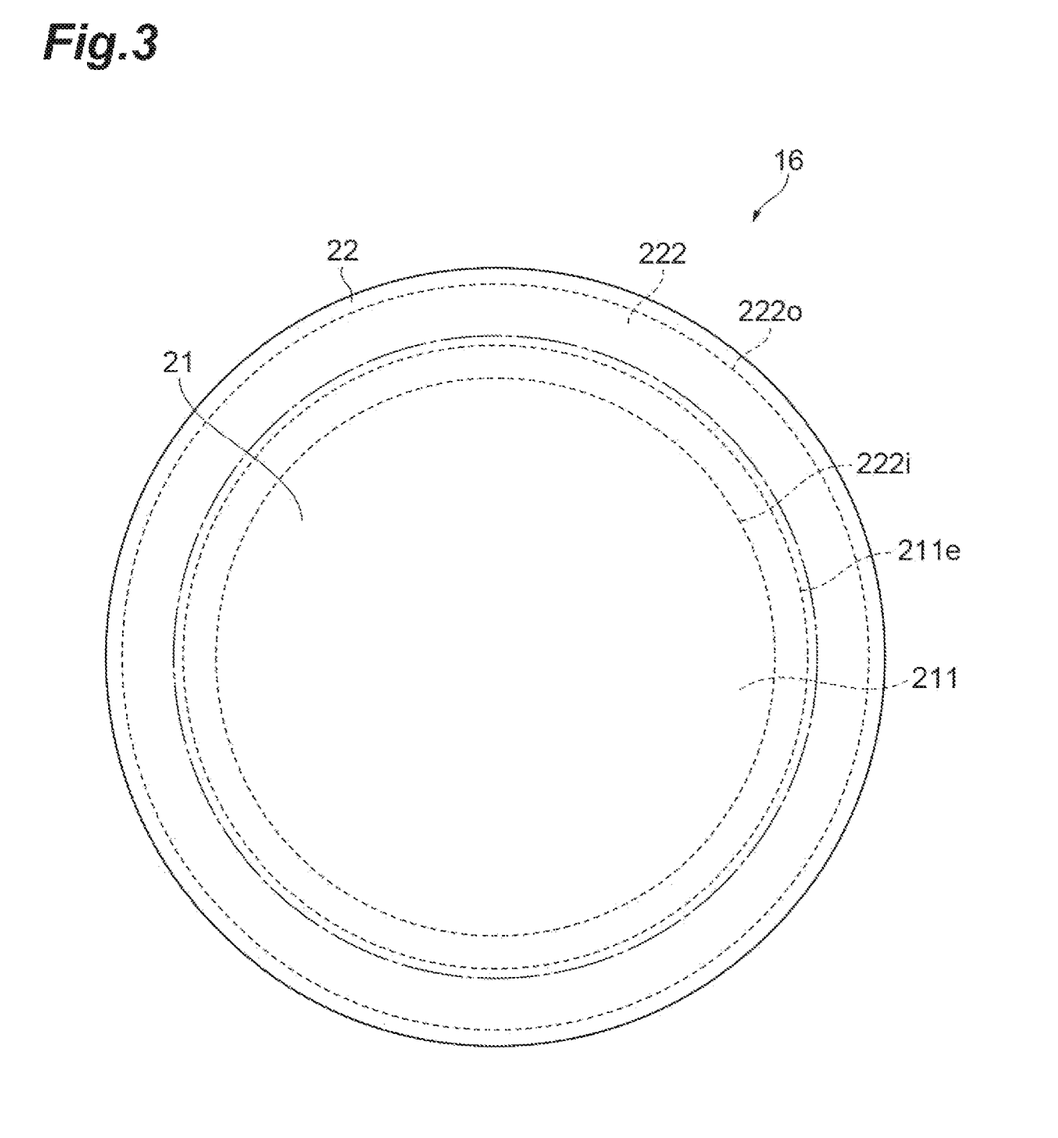
FIG. 3 is a plan view schematically showing a first region, a second region, a first electrode, and a second electrode in a substrate support according to an exemplary embodiment.

The substrate support 16 has a first region 21 and a second region 22. FIG. 3 is a plan view schematically showing the first region, the second region, a first electrode, and a second electrode in the substrate support according to an exemplary embodiment. Hereinafter, FIG. 3 will be referred to together with FIGS. 1 and 2. The first region 21 is a central region of the substrate support 16. The first region 21 includes the central region of the electrostatic chuck 20. The second region 22 extends in a circumferential direction on the outside in a radial direction with respect to the first region 21. The second region 22 includes a peripheral edge region of the electrostatic chuck 20. In the plasma processing apparatus 1, the first region 21 and the second region 22 are configured from a single electrostatic chuck 20 and are integrated with each other. In FIG. 1, the boundary between the first region 21 and the second region 22 is indicated by a broken line. Further, in FIG. 3, the boundary between the first region 21 and the second region 22 is indicated by a dashed-dotted line.

The first region 21 is configured to support the substrate W placed thereon (that is, on the upper surface thereof). The first region 21 is a region having a disk shape. The central axis of the first region 21 substantially coincides with the axis AX. The first region 21 shares the dielectric portion 20d with the second region 22. The dielectric portion 20d has a substantially disk shape. In an embodiment, the thickness of the dielectric portion 20d in the second region 22 is smaller than the thickness of the dielectric portion 20d in the first region 21. The position in the vertical direction of the upper surface of the dielectric portion 20d in the second region 22 may be lower than the position in the vertical direction of the upper surface of the dielectric portion 20d in the first region 21.

The first region 21 has the electrode 21a (chuck electrode). The electrode 21a is an electrode having a film shape and is provided in the dielectric portion 20d in the first region 21. The planar shape of the electrode 21a may be a circular shape. The central axis of the electrode 21a substantially coincides with the axis AX. A direct-current power source 55 is connected to the electrode 21a through a switch 56. When a direct-current voltage from the direct-current power source 55 is applied to the electrode 21a, an electrostatic attraction force is generated between the first region 21 and the substrate W. Due to the generated electrostatic attraction force, the substrate W is attracted to the first region 21 and held by the first region 21. That is, the first region 21 configures a first electrostatic chuck configured to hold the substrate W placed thereon.

The substrate support 16 further has a first electrode 211. The first electrode 211 is an electrode having a film shape and is provided in the dielectric portion 20d in the first region 21. The planar shape of the first electrode 211 may be a circular shape. The central axis of the first electrode 211 substantially coincides with the axis AX. The electrode 21a may extend closer to the upper surface of the first region 21 than the first electrode 211 in the vertical direction.

The plasma processing apparatus 1 is further provided with a first bias power source 61. The first bias power source 61 is electrically connected to the first electrode 211 through a circuit 62. The first bias power source 61 generates a first electrical bias. The first electrical bias is applied to the first electrode 211.

In an embodiment, the first electrical bias is a radio frequency bias power. The radio frequency bias power has a second frequency. The second frequency may be lower than the first frequency. The second frequency may be a frequency within the range of 100 kHz to 13.56 MHz. The second frequency is, for example 400 kHz. In a case where the first electrical bias is a radio frequency bias power, the circuit 62 is a matching circuit. The circuit 62 is configured to match the impedance on the load side of the first bias power source 61 with the output impedance of the first bias power source 61.

In another embodiment, the first electrical bias is a pulse wave that is periodically generated at the second frequency described above. In each cycle, the pulse wave includes a pulse of a negative direct-current voltage. The voltage level of the pulse wave may be 0 V in a period other than a period in which the pulse of the negative direct-current voltage continues in the cycle. Alternatively, the voltage of the pulse wave may have an absolute value lower than the absolute value of the voltage of the pulse in the period other than the period in which the pulse of the negative direct-current voltage continues in the cycle. The voltage level of the pulse may temporally change within the cycle. In a case where the first electrical bias is a pulse wave that is periodically generated, the circuit 62 may be an electrical filter configured to block or attenuate the radio frequency power from the radio frequency power source 57.

The second region 22 extends to surround the first region 21. The second region 22 is a substantially annular region. The central axis of the second region 22 substantially coincides with the axis AX. The second region 22 is configured to support the edge ring ER placed thereon (that is, on the upper surface thereof). The second region 22 shares the dielectric portion 20d with the first region 21.

In an embodiment, the second region 22 may hold the edge ring ER by an electrostatic attraction force. That is, the second region 22 may configure a second electrostatic chuck configured to hold the edge ring ER placed thereon. In this embodiment, the second region 22 may have one or more electrodes (chuck electrodes). In an embodiment, the second region 22 has a pair of electrodes, that is, the electrode 22a and the electrode 22b. The electrode 22a and the electrode 22b are provided in the dielectric portion 20d in the second region 22. The electrode 22a and the electrode 22b configure a bipolar electrode. That is, in an embodiment, the second region 22 configures a bipolar electrostatic chuck. Each of the electrode 22a and the electrode 22b is an electrode having a film shape. The planar shape of each of the electrode 22a and the electrode 22h is, for example, a ring shape. The electrode 22a may extend inside the electrode 22b. The electrode 22a and the electrode 22b may extend at substantially the same height position in the vertical direction. The electrode 22a and the electrode 22b may extend closer to the upper surface of the second region 22 in the vertical direction than a second electrode 222 (described later).

A direct-current power source 71 is connected to the electrode 22a through a switch 72 and a filter 73. The filter 73 is an electrical filter configured to block or attenuate the radio frequency power and the first and second electrical biases. A direct-current power source 74 is connected to the electrode 22b through a switch 75 and a filter 76. The filter 76 is an electrical filter configured to block or reduce the radio frequency power and the first and second electrical biases.

The direct-current power source 71 and the direct-current power source 74 apply direct-current voltages to the electrodes 22a and 22b, respectively, such that a potential difference is generated between the electrode 22a and the electrode 22b. The set potential of each of the electrodes 22a and 22b may be any of positive potential, negative potential, and 0 V. For example, the potential of the electrode 22a may be set to a positive potential, and the potential of the electrode 22b may be set to a negative potential. Further, the potential difference between the electrode 22a and the electrode 22b may be formed by using a single direct-current power source instead of the two direct-current power sources.

When a potential difference is generated between the electrode 22a and the electrode 22b, an electrostatic attraction force is generated between the second region 22 and the edge ring ER. The edge ring ER is attracted to the second region 22 by the generated electrostatic attraction force and held by the second region 22. The second region 22 may configure a unipolar electrostatic chuck. In a case where the second region 22 is a unipolar electrostatic chuck, a direct-current voltage is applied to one or more chuck electrodes in the second region 22.

The substrate support 16 further have the second electrode 222. The second electrode 222 is an electrode having a film shape. The second electrode 222 is provided in the dielectric portion 20d. The second electrode 222 is provided in at least the second region 22. The second electrode 222 is separated from the first electrode 211. The second electrode 222 extends below the first electrode 211 to face the first electrode 211 within the first region 21. In an embodiment, the planar shape of the second electrode 222 may be a ring shape. In this embodiment, the central axis of the second electrode 222 substantially coincides with the axis AX. In this embodiment, the radius of an inner edge 222i of the second electrode 222 is smaller than the radius of an outer edge 211e of the first electrode 211, and the radius of an outer edge 222o of the second electrode 222 is larger than the radius of the outer edge 211e of the first electrode 211.

The plasma processing apparatus 1 is further provided with a second bias power source 81. The second bias power source 81 is electrically connected to the second electrode 222 through a circuit 82. The second bias power source 81 generates a second electrical bias. The second electrical bias is applied to the second electrode 222.

In an embodiment, the second electrical bias is a radio frequency bias power. The radio frequency bias power has the second frequency described above. In a case where the second electrical bias is a radio frequency bias power, the circuit 82 is a matching circuit. The circuit 82 is configured to match the impedance on the load side of the second bias power source 81 with the output impedance of the second bias power source 81.

In another embodiment, the second electrical bias is a pulse wave that is periodically generated at the second frequency described above. In each cycle, the pulse wave includes a pulse of a negative direct-current voltage. The voltage level of the pulse wave may be 0 V in a period other than a period in which the pulse of the negative direct-current voltage continues in the cycle. Alternatively, the voltage of the pulse wave may have an absolute value lower than the absolute value of the voltage of the pulse in the period other than the period in which the pulse of the negative direct-current voltage continues in the cycle. The voltage level of the pulse may temporally change within a cycle. In a case where the second electrical bias is a pulse wave that is periodically generated, the circuit 82 may be an electrical filter configured to block or attenuate the radio frequency power from the radio frequency power source 57.

The second region 22 may further have a gas line 22g. The gas line 22g is a gas line provided for supplying heat transfer gas, for example, a He gas, to the gap between the second region 22 and the edge ring ER. The gas line 22g is connected to a gas supply mechanism 86 which is a heat transfer gas source.

In an embodiment, as shown in FIG. 2, the plasma processing apparatus 1 is further provided with a controller MC. The controller MC is a computer which includes a processor, a storage device, an input device, a display device, and the like, and controls each part of the plasma processing apparatus 1. Specifically, the controller MC executes a control program stored in the storage device, and controls each part of the plasma processing apparatus 1, based on recipe data stored in the storage device. A process designated by the recipe data is performed in the plasma processing apparatus 1 under the control by the controller MC.

As described above, in the substrate support 16, since the first electrode 211 and the second electrode 222 face each other within the first region 21, the first electrode 211 and the second electrode 222 are capacitively coupled to each other within the first region 21. Therefore, a part of the second electrical bias is applied to the first electrode 211, and a part of the first electrical bias is applied to the second electrode 222. Therefore, the potential difference between the first electrode 211 and the second electrode 222 due to the phase difference between the first electrical bias and the second electrical bias is reduced, and the potential difference between the substrate W and the edge ring ER is reduced. As a result, the influence of the phase difference between the first electrical bias and the second electrical bias on the plasma processing is reduced.

Figure 4:
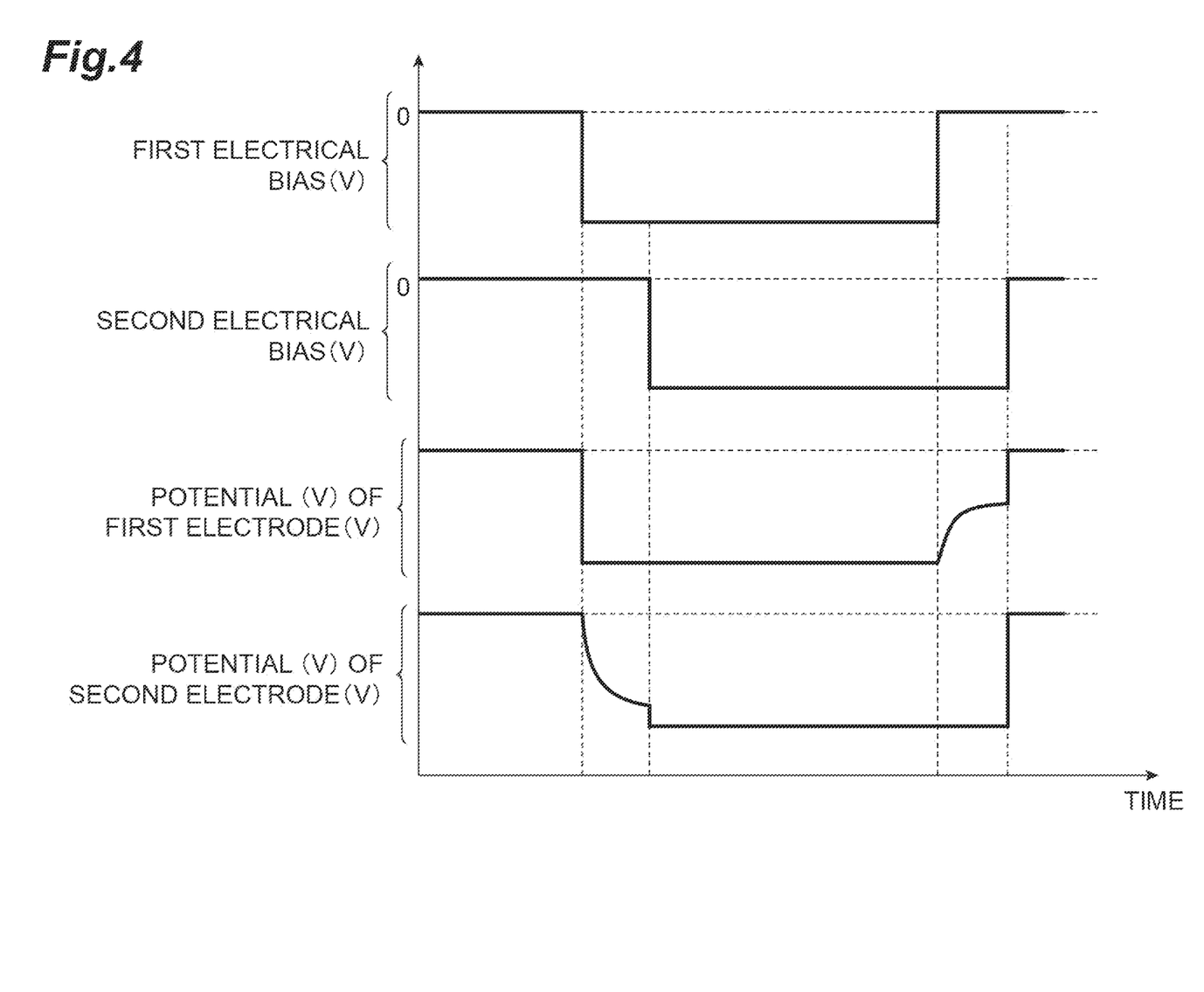
FIG. 4 is a timing chart of an example of a first electrical bias, a second electrical bias, a potential of the first electrode, and a potential of the second electrode.

FIG. 4 will be referred to. FIG. 4 is a timing chart of an example of the first electrical bias, the second electrical bias, the potential of the first electrode, and the potential of the second electrode. In the example shown in FIG. 4, each of the first electrical bias and the second electrical bias is a pulse wave. In the example shown in FIG. 4, the phase of the second electrical bias is delayed with respect to the phase of the first electrical bias. However, even in a period in which the second electrical bias is not applied to the second electrode 222, a part of the first electrical bias is applied to the second electrode 222. Further, even in a period in which the first electrical bias is not applied to the first electrode 211, a part of the second electrical bias is applied to the first electrode 211. Therefore, the potential difference between the first electrode 211 and the second electrode 222 due to the phase difference between the first electrical bias and the second electrical bias is reduced, and the potential difference between the substrate W and the edge ring ER is reduced.

Figure 5:
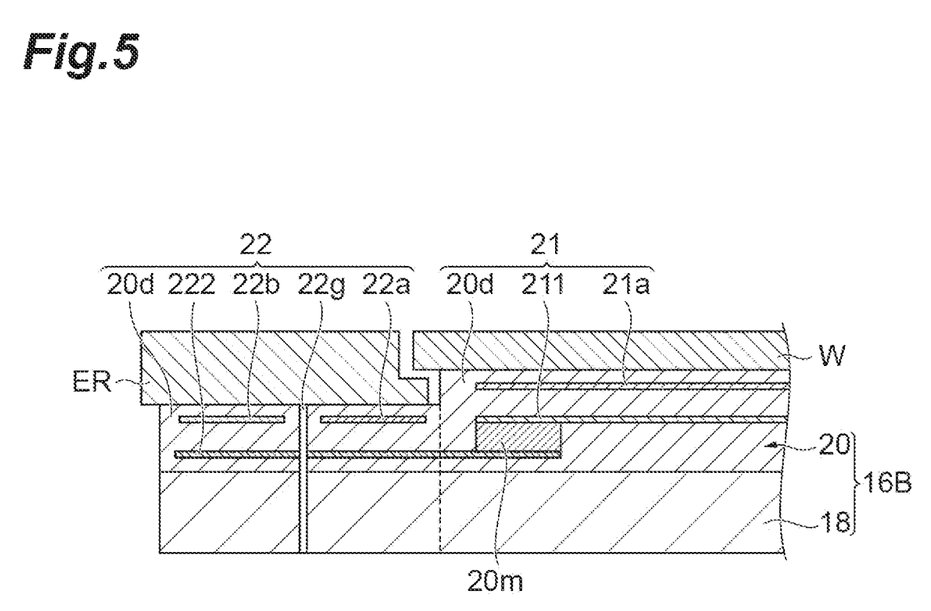
FIG. 5 is a partially enlarged sectional view of a substrate support according to another exemplary embodiment.

FIG. 5 will be referred to. FIG. 5 is a partially enlarged sectional view of a substrate support according to another exemplary embodiment. A substrate support 16B shown in FIG. 5 may be adopted instead of the substrate support 16 in the plasma processing apparatus 1. The substrate support 16B has a dielectric portion 20m, that is, a second dielectric portion, in addition to the dielectric portion 20d, that is, a first dielectric portion. Other configurations of the substrate support 16B may be the same as the corresponding configurations of the substrate support 16. The dielectric portion 20d extends around the first electrode 211. The dielectric portion 20m is formed of a dielectric different from the dielectric forming the dielectric portion 20d. The dielectric portion 20m is provided between the first electrode 211 and the second electrode 222. According to this embodiment, by appropriately selecting the dielectric forming the dielectric portion 20m, it becomes possible to set the capacitance of a capacitor that is formed between the first electrode 211 and the second electrode 222. In an embodiment, the dielectric portion 20m may be formed of a dielectric having a dielectric constant higher than the dielectric constant of the dielectric forming the dielectric portion 20d and a high dielectric strength. The dielectric portion 20m is formed of, for example, zirconia ($ZrO_2$).

Figure 6:
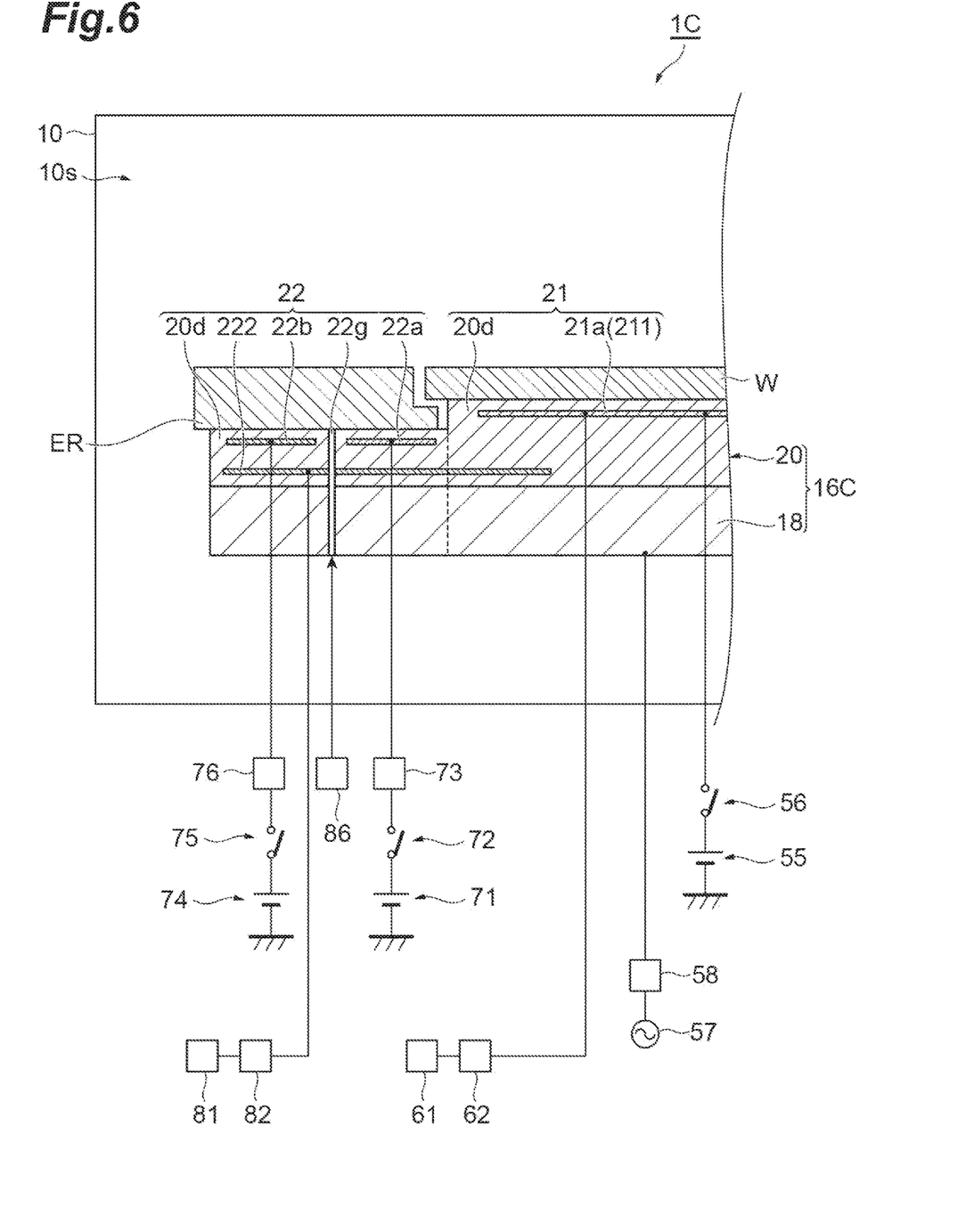
FIG. 6 schematically illustrates a plasma processing apparatus according to another exemplary embodiment.

FIG. 6 will be referred to. FIG. 6 schematically illustrates a plasma processing apparatus according to another exemplary embodiment. A plasma processing apparatus 1C shown in FIG. 6 is provided with a substrate support 16C. The substrate support 16C is different from the substrate support 16 in that the electrode 21a also serves as the first electrode 211. Other configurations of the substrate support 16C may be the same as the corresponding configurations of the substrate support 16. Further, other configurations of the plasma processing apparatus 1C may be the same as the corresponding configurations of the plasma processing apparatus 1. Also in the substrate support 16C, as with the substrate support 16B, the dielectric portion 20m different from the dielectric portion 20d may be provided between the first electrode 211 and the second electrode 222.

Figure 7:
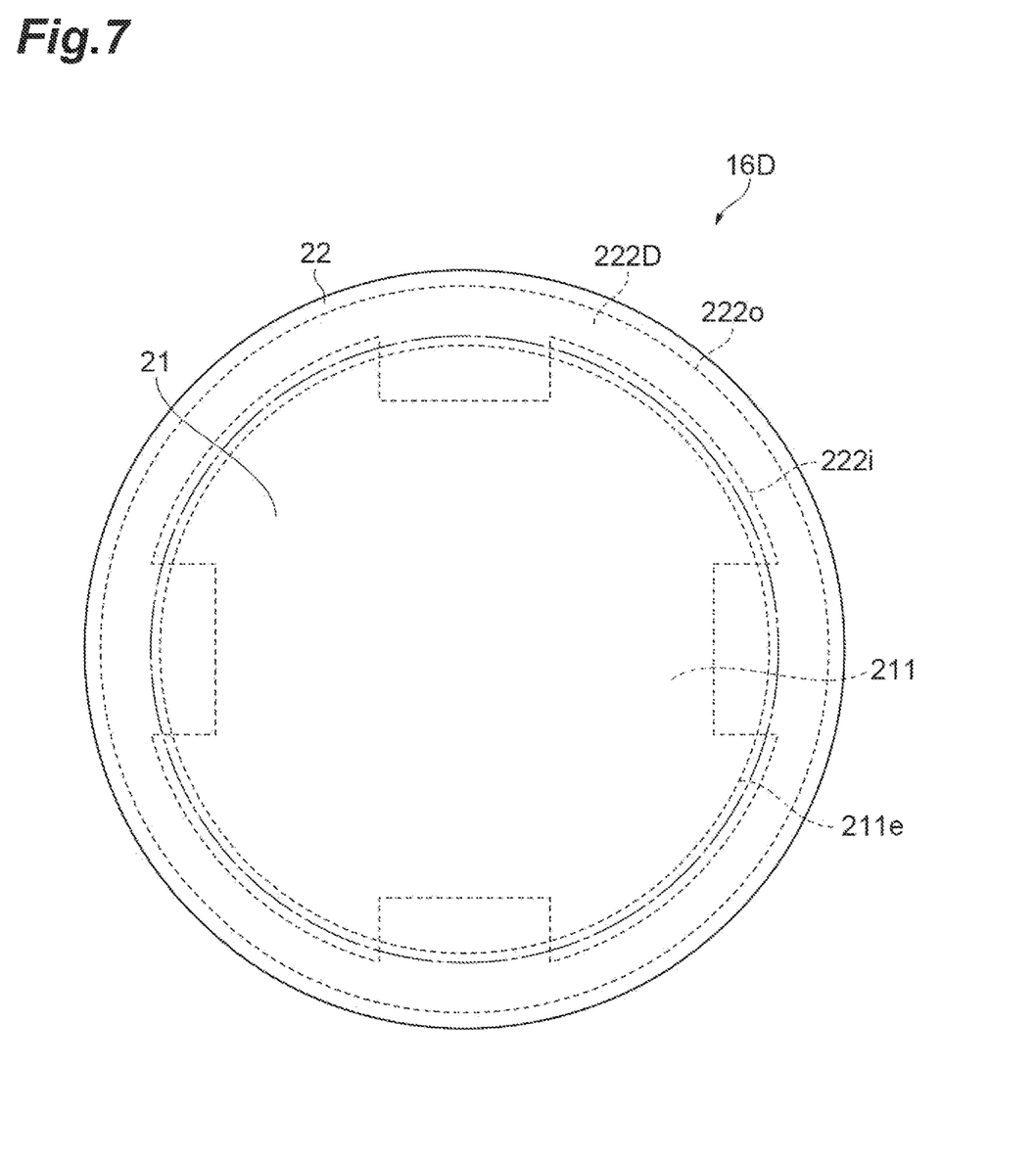
FIG. 7 is a plan view schematically showing a first region, a second region, a first electrode, and a second electrode in a substrate support according to still another exemplary embodiment.

FIG. 7 will be referred to. FIG. 7 is a plan view schematically showing a first region, a second region, a first electrode, and a second electrode in a substrate support according to still another exemplary embodiment. A substrate support 16D shown in FIG. 7 may be adopted instead of the substrate support 16 in the plasma processing apparatus 1 or 1C. The substrate support 16D has a second electrode 222D instead of the second electrode 222. The second electrode 222D is different from the second electrode 222 in that a plurality of portions on the inner edge side thereof protrude from the second region 22 into the first region 21. Other configurations of the substrate support 16D may be the same as the corresponding configurations of the substrate support 16. As with the second electrode 222D in the substrate support 16D, one or more portions on the inner edge side of the second electrode of the substrate support may protrude into the first region and extend below the first electrode.

Also in the substrate support 16D, as with the substrate support 16B, the dielectric portion 20m different from the dielectric portion 20d may be provided between the first electrode 211 and the second electrode 222D. Also in the substrate support 16D, the electrode 21a may also serve as the first electrode 211.

Figure 8:
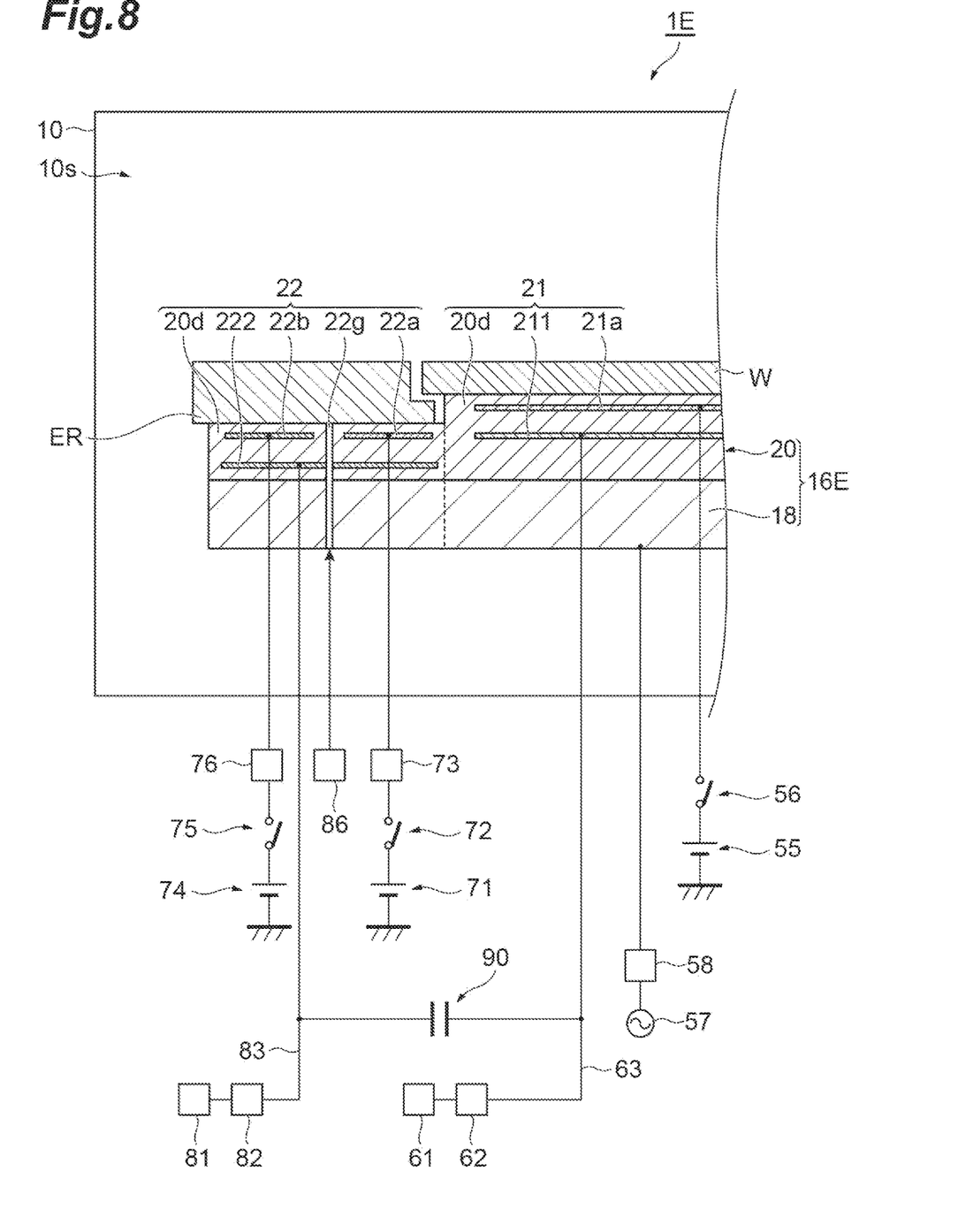
FIG. 8 schematically illustrates a plasma processing apparatus according to still another exemplary embodiment.

FIG. 8 will be referred to. FIG. 8 schematically illustrates a plasma processing apparatus according to still another exemplary embodiment. A plasma processing apparatus 1E shown in FIG. 8 is provided with a substrate support 16E. The substrate support 16E is different from the substrate support 16 in that the second electrode 222 extends within the second region 22 and does not extend into the first region 21. Other configurations of the substrate support 16E may be the same as the corresponding configurations of the substrate support 16. In the plasma processing apparatus 1E, a capacitor 90 is connected between a first electrical path 63 and a second electrical path 83. The first electrical path 63 is connected between the first bias power source 61 and the first electrode 211. The second electrical path 83 is connected between the second bias power source 81 and the second electrode 222. The capacitor 90 may be a fixed capacitance capacitor or a variable capacitor. Other configurations of the plasma processing apparatus 1E may be the same as the corresponding configurations of the plasma processing apparatus 1.

In the plasma processing apparatus 1E, the first electrode 211 and the second electrode 222 are capacitively coupled to each other by the capacitor 90. Therefore, a part of the second electrical bias is applied to the first electrode 211, and a part of the first electrical bias is applied to the second electrode 222. Therefore, the potential difference between the first electrode 211 and the second electrode 222 due to the phase difference between the first electrical bias and the second electrical bias is reduced, and the potential difference between the substrate W and the edge ring ER is reduced. As a result, the influence of the phase difference between the first electrical bias and the second electrical bias on the plasma processing is reduced.

Figure 9:
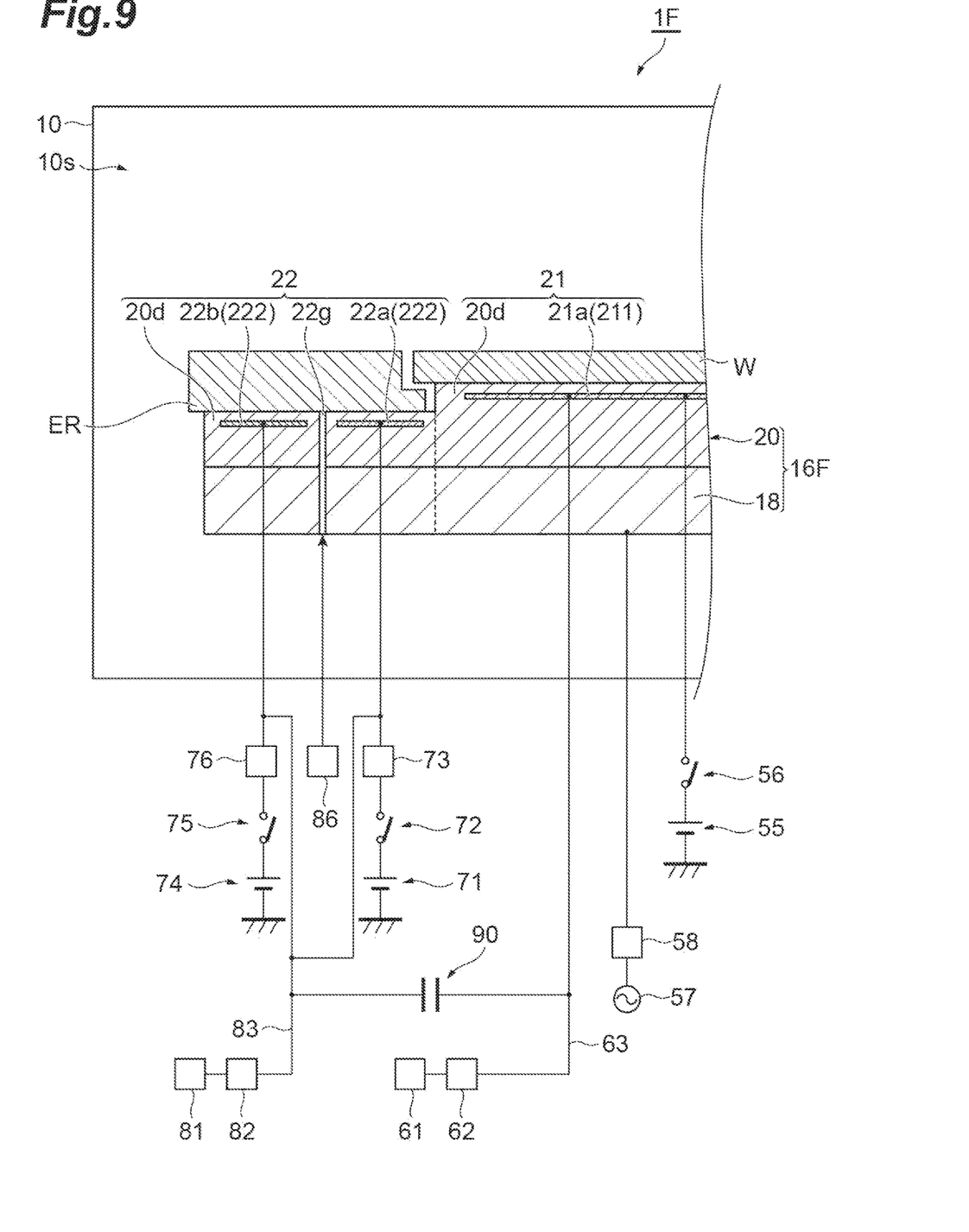
FIG. 9 schematically illustrates a plasma processing apparatus according to still another exemplary embodiment.

FIG. 9 will be referred to. FIG. 9 schematically illustrates a plasma processing apparatus according to still another exemplary embodiment. A plasma processing apparatus 1F shown in FIG. 9 is provided with a substrate support 16F. The substrate support 16F is different from the substrate support 16E in that the electrode 21a also serves as the first electrode 211 and the electrodes 22a and 22b also serve as the second electrode 222. Other configurations of the substrate support 16F may be the same as the corresponding configurations of the substrate support 16E. Further, other configurations of the plasma processing apparatus 1F may be the same as the corresponding configurations of the plasma processing apparatus 1E. In the substrate support 16F, the first electrode 211 may be an electrode different from the electrode 21a. Alternatively, the second electrode 222 may be an electrode different from the electrodes 22a and 22b.

While various exemplary embodiments have been described above, various additions, omissions, substitutions and changes may be made without being limited to the exemplary embodiments described above. Elements of the different embodiments may be combined to form another embodiment.

In another embodiment, the plasma processing apparatus may be another type of plasma processing apparatus. The other type of plasma processing apparatus is, for example, an inductively coupled plasma processing apparatus, an electron cyclotron resonance (ECR) plasma processing apparatus, or a plasma processing apparatus that generates plasma by using surface waves such as microwaves.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for plasma processing comprising:
   a chamber;
   a substrate support configured to support a substrate and an edge ring in the chamber,
   a first bias power source configured to generate a first electrical bias; and
   a second bias power source configured to generate a second electrical bias, wherein
   the substrate support comprises:
      a lower electrode in which a flow path for a heat exchange medium is formed; and
      an electrostatic chuck on the lower electrode,
   the electrostatic chuck comprises:
      a first region configured to hold a substrate placed thereon;
      a second region provided to surround the first region and configured to hold an edge ring placed thereon, a thickness of the second region being smaller than a thickness of the first region;
      a first electrode provided in the first region to receive the first electrical bias, the first bias power source electrically connected to the first electrode; and
      a second electrode provided in at least the second region to receive the second electrical bias, the second bias power source electrically connected to the second electrode,
   the second electrode extends below the first electrode to face the first electrode within the first region,
   at least a part of the second electrode protrudes from the second region into the first region,
   the electrostatic chuck includes a single dielectric portion, the first region and the second region being configured by a central region and a peripheral region of the single dielectric portion, respectively,
   the first region includes a chuck electrode, a vertical position of the chuck electrode being higher than an upper surface of the second region,
   each of the first electrical bias and the second electrical bias is a pulse wave that includes a pulse of a direct-current voltage and is periodically generated, and
   the lower electrode is electrically connected to a radio frequency power source to receive a radio frequency power from the radio frequency power source, the radio frequency power having a frequency not lower than 27 MHz and not higher than 100 MHz.

2. The apparatus according to claim 1, wherein the first region configures a first electrostatic chuck configured to hold the substrate placed thereon, and the second region configures a second electrostatic chuck configured to hold the edge ring placed thereon.

3. The apparatus according to claim 1, wherein the first region has
- a first dielectric portion extending around the first electrode, and
- a second dielectric portion formed of a dielectric different from a dielectric forming the first dielectric portion, and provided between the first electrode and the second electrode.

4. The apparatus according to claim 1, wherein the pulse is a pulse of a negative direct-current voltage.

5. The apparatus according to claim 1, wherein the chuck electrode extends between an upper surface of the first region and the first electrode.

6. The apparatus according to claim 1, wherein a part of the first electrode and a part of the second electrode vertically overlap with each other below the chuck electrode.

7. The apparatus according to claim 1, wherein the second region includes an other chuck electrode.

* * * * *